US 7,663,436 B2

(12) United States Patent
Takano et al.

(10) Patent No.: US 7,663,436 B2
(45) Date of Patent: Feb. 16, 2010

(54) POWER AMPLIFIER WITH DISTORTION COMPENSATION CIRCUIT

(75) Inventors: Takeshi Takano, Kawasaki (JP); Yasuyuki Oishi, Kawasaki (JP); Toru Maniwa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/000,616

(22) Filed: Dec. 14, 2007

(65) Prior Publication Data

US 2008/0094139 A1   Apr. 24, 2008

Related U.S. Application Data

(63) Continuation of application No. PCT/JP2005/012028, filed on Jun. 30, 2005.

(51) Int. Cl.
*H03F 1/26* (2006.01)
(52) U.S. Cl. .................... 330/149; 330/278; 330/289
(58) Field of Classification Search ............ 330/149, 330/278, 289
See application file for complete search history.

(56) References Cited

U.S. PATENT DOCUMENTS

| | | | |
|---|---|---|---|
| 6,737,918 B2* | 5/2004 | Oishi et al. ............ | 330/149 |
| 6,909,756 B1 | 6/2005 | Nakajima | |
| 6,943,627 B2* | 9/2005 | Leyonhjelm et al. ...... | 330/149 |
| 2001/0005402 A1 | 6/2001 | Nagatani et al. | |
| 2003/0222712 A1 | 12/2003 | Kim et al. | |
| 2004/0142667 A1* | 7/2004 | Lochhead et al. ....... | 455/114.3 |
| 2004/0217810 A1 | 11/2004 | Honcharenko et al. | |
| 2005/0047521 A1 | 3/2005 | Ishikawa et al. | |
| 2005/0068102 A1 | 3/2005 | Hongo et al. | |
| 2008/0187035 A1* | 8/2008 | Nakamura et al. ........ | 375/232 |

FOREIGN PATENT DOCUMENTS

| | | |
|---|---|---|
| JP | 2001-111438 | 4/2001 |
| JP | 2001-189685 | 7/2001 |
| JP | 2001-320246 | 11/2001 |
| JP | 2004-187218 | 7/2004 |
| JP | 2004-336750 | 11/2004 |
| JP | 2005-101908 | 4/2005 |
| WO | WO 03/103163 | 12/2003 |

OTHER PUBLICATIONS

Supplementary European Search Report corresponding to EP Application No. 05765182.0-1233 dated Jul. 16, 2008.
European Patent Office Action based on application No. 05765182.0-1233 (dated Oct. 22, 2008).

* cited by examiner

*Primary Examiner*—Patricia Nguyen
(74) *Attorney, Agent, or Firm*—Hanify & King, PC

(57) ABSTRACT

A power amplifier negates a memory effect and is applied a linearizer using a digital predistortion system even in an inexpensive device. The power amplifier compares an input signal power against a sampled component of an output power, and provides predistortion to the input signal power so as to minimize a difference as a result of the comparison. The power amplifier comprises a gain lookup table storing a gain coefficient value corresponding to a temperature address determined for an input power; a phase lookup table storing a phase coefficient value corresponding to the temperature address determined for the input power; a transversal filter, which is input with the input power, and which outputs the temperature address; and a coefficient multiplier modulating the input signal using a gain coefficient value and a phase coefficient value, which correspond to the temperature address and which are read out from the gain coefficient lookup table and the phase lookup table.

6 Claims, 5 Drawing Sheets

POWER AMPLIFIER WITH DISTORTION COMPENSATION CIRCUIT

CROSS REFERENCE TO RELATED APPLICATIONS

This application is a continuation of International Application No. PCT/JP2005/12028, filed on Jun. 30, 2005, now pending, herein incorporated by reference.

TECHNICAL FIELD

The present invention relates to a power amplifier having a distortion compensation circuit, and more particularly to a power amplifier having a distortion compensation circuit, which compensates for nonlinear distortion resulting from a memory effect.

BACKGROUND of THE INVENTION

In recent years, most wireless communication systems have come to employ digitalized, high-efficiency transmissions. When a linear modulation system is applied to wireless communications, technology for curbing nonlinear distortion by linearizing amplification characteristics of a power amplifier and reducing adjacent-channel leakage power is important, especially on a transmitting side. Further, when using an amplifier with poor linearity and attempting to enhance power efficiency, technology for compensating for the resulting nonlinear distortion is essential.

To compensate for such nonlinear distortion, a distortion compensation apparatus, which applies predistortion (a distortion compensation value) corresponding to the nonlinear distortion generated by the power amplifier to a signal on the input side is known (for example, Patent Document 1: Japanese Patent Laid-open No. 2001-189685, Patent Document 2: PCT International Publication No. WO2003-103163, and Patent Document 3: Japanese Patent Laid-open No. 2005-101908).

This distortion compensation apparatus sets a distortion compensation value corresponding to a signal level to be amplified in a distortion compensation table beforehand, reads a corresponding distortion compensation value from the distortion compensation table in accordance with the input signal level, and applies this value to the input signal.

In a mobile device for a TDMA system, the uplink signal here constitutes a burst mode. Thus, the temperature of the mobile device power amplifier drops in a transmission signal stop state, and the temperature rises once again at the leading edge of a burst.

Then, the respective parameters of the power amplifier (power amplifier AM/AM: output amplitude fluctuation relative to an input amplitude, AM/PM: output phase fluctuation relative to an input amplitude, carrier leakage in orthogonal modulator, DC offset in orthogonal demodulator, and so forth) fluctuate as the result of a temperature fluctuation, giving rise to nonlinear distortion. Furthermore, the temperature rise and temperature drop in the above-mentioned power amplifier have characteristics, which are manifested by temporal delays in input signal changes due to the cumulative effects of heat. The relationship between the characteristics of temperature fluctuations like this and power amplifier output characteristics is known as the memory effect.

FIG. 1 is a diagram showing another example of the memory effect in such an amplifier. The horizontal axis represents time, and the vertical axis shows the relationship between input power (amplitude) A and the junction temperature K of an amplifying semiconductor power device. For example, when a large input power (amplitude) input in the past transitions until it reaches the smaller present input power (amplitude) A at time T1 (solid line), the fluctuation in temperature (broken line) lags behind the change in input power due to the accumulation of heat, and is the state of temperature K1 for the most part. By contrast, at time T2, the small input power transitions to rise up to the present input power A, but the fluctuation in temperature (broken line) is a low temperature K2 state.

That is, the temperatures K1, K2 differ at times T1, T2 even though the amplitude level is the same. This shows that the temperature does not ordinarily coincide with the heating value (proportional to power consumption) corresponding to an amplitude level due to the build up of heat in the metal surrounding the power device. This is referred to as the thermal memory effect.

Because the temperature accumulation (memory) at the time of the past input power remains like this, setting a (linearized) distortion compensation value corresponding to an input power (amplitude) value in the distortion compensation table does not enable adequate compensation for distortion. Consequently, if temperature fluctuations are taken into account, it becomes impossible to use a compensation table in which the same compensation value is set for the same input amplitude, requiring a different compensation method from that used when there is no memory effect.

That is, based on the relationship shown in FIG. 1, the distortion compensation values set in the distortion compensation table at different times T1, T2 for the same amplitude A can be the same when the memory effect is not a factor. Meanwhile, the junction temperature of a semiconductor amplifying device at time T1 can be expected to be higher than at time T2. Therefore, the AM/AM and AM/PM characteristics of an amplifier, which makes use of a power device having characteristics for which temperatures will differ in conformance with these times, will change in accordance with the temperature as shown in FIG. 2. In FIG. 2, A represents the AM/AM characteristic, and B represents the AM/PM characteristic. The AM/AM characteristic A is characterized in that gain diminishes in the area where the input level increases, and displaces in the direction of arrow a when the temperature rises. Conversely, the AM/PM characteristic is characterized in that phase rotation increases when the input level increases, and furthermore, displaces in the direction of arrow b in which the phase increases even more when the temperature rises.

SUMMARY OF THE INVENTION

Therefore, an object of the present invention is to provide an inexpensive, high-power-efficiency power amplifier, which is capable of negating the above-mentioned memory effect that exists in a power amplifier, and of applying a digital predistortion-type linearizer to even an inexpensive device.

A first aspect of the present invention for achieving the above-mentioned object is a power amplifier having a distortion compensation circuit, which compares the power of an input signal against a sample component of an output power, and provides predistortion to the input power so as to minimize the difference between the comparison results, having a gain lookup table for storing a gain coefficient value corresponding to a temperature address determined for an input power; a phase lookup table for storing a phase coefficient value corresponding to a temperature address determined for the input power; a transversal filter, which is input with the input power, and which outputs the temperature address; and a coefficient multiplier for modulating the input signal using a gain coefficient value and a phase coefficient value, which correspond to the temperature address and which are read out from the gain coefficient lookup table and phase lookup table.

In a second aspect of the present invention for achieving the above-mentioned object, a power amplifier having a distortion compensation circuit, which compares the power of an input signal against a sample component of an output power, and provides predistortion to the input power so as to minimize the difference between the comparison results, has a distortion compensation coefficient lookup table, which stores a distortion compensation coefficient in a specified write address, and outputs a distortion compensation coefficient stored in a specified read address; a first multiplier for modulating the input signal using a distortion compensation coefficient output from this distortion compensation coefficient lookup table; a distortion compensation operator for computing a distortion compensation coefficient based on the power of the input signal and an amplified transmission signal, a distortion compensation coefficient stored in the distortion compensation coefficient lookup table being updated using the distortion compensation coefficient computed by the distortion compensation operator, and the power amplifier further has a gain lookup table for storing a gain coefficient value corresponding to a temperature address determined for the input power; a phase lookup table for storing a phase coefficient value corresponding to a temperature address determined for the input power; a transversal filter, which is input with the input power, and which outputs the temperature address; and a second multiplier for modulating the output of the first multiplier using a gain coefficient value and a phase coefficient value, which correspond to the temperature address and which are read out from the gain coefficient lookup table and phase lookup table.

Furthermore, the gain coefficient value and phase coefficient value, which are respectively stored in the gain lookup table and phase lookup table in the above-described characteristic features, are determined by applying a pulse signal having a pulse width Tw, an amplitude Ak, and a pulse duration Td, as input, taking the amplitude difference with the output power detected at this time as Ad (Tw, Ak, Td) and taking the phase difference with the output power detected at this time as Φd (Tw, Ak, Td), measuring an amount of change of the amplitude difference Ad and an amount of change of the phase difference Φd when the amplitude Ak is changed by ΔA, and defining the respective change ratios Gd, Pd by the following equations:

$$Gd=\{Ad(Tw,Ak,Td)-Ad(Tw,Ak+\Delta A,Td)\}/\Delta A$$

$$Pd=\{\Phi d(Tw,Ak,Td)-\Phi d(Tw,Ak+\Delta A,Td)\}/\Delta A$$

The Gd and Pd are respectively set as the gain coefficient value and the phase coefficient value stored in the gain lookup table and phase lookup table.

Further, the pulse width Tw and pulse duration Td are further changed, and the AM/AM characteristic and the AM/PM characteristic when the pulse width Tw is a minimum value are treated as normal temperature characteristics, and [characteristics] when the AM/AM characteristic and the AM/PM characteristic cease to change are treated as the maximum temperature characteristics, and the change ratios Gd and Pd can be determined for an AM/AM characteristic and an AM/PM characteristic determined corresponding to the temperature of (maximum temperature−normal temperature)/N, taking resolution as N.

Furthermore, in the above-described characteristic features, the weighting coefficients for the respective taps of the transversal filter are perturbed, and are set so as to output an optimum temperature address for minimizing the distortion component.

The characteristic features of the present invention will become clearer from the embodiment, which will be explained hereinbelow in accordance with the figures.

DETAILED DESCRIPTION OF THE PREFERRED EMBODIMENTS

The embodiment of the present invention will be explained below in accordance with the figures. Furthermore, the embodiment is for understanding the present invention, and the technical scope of the present invention is not limited to this embodiment.

Figure 3:
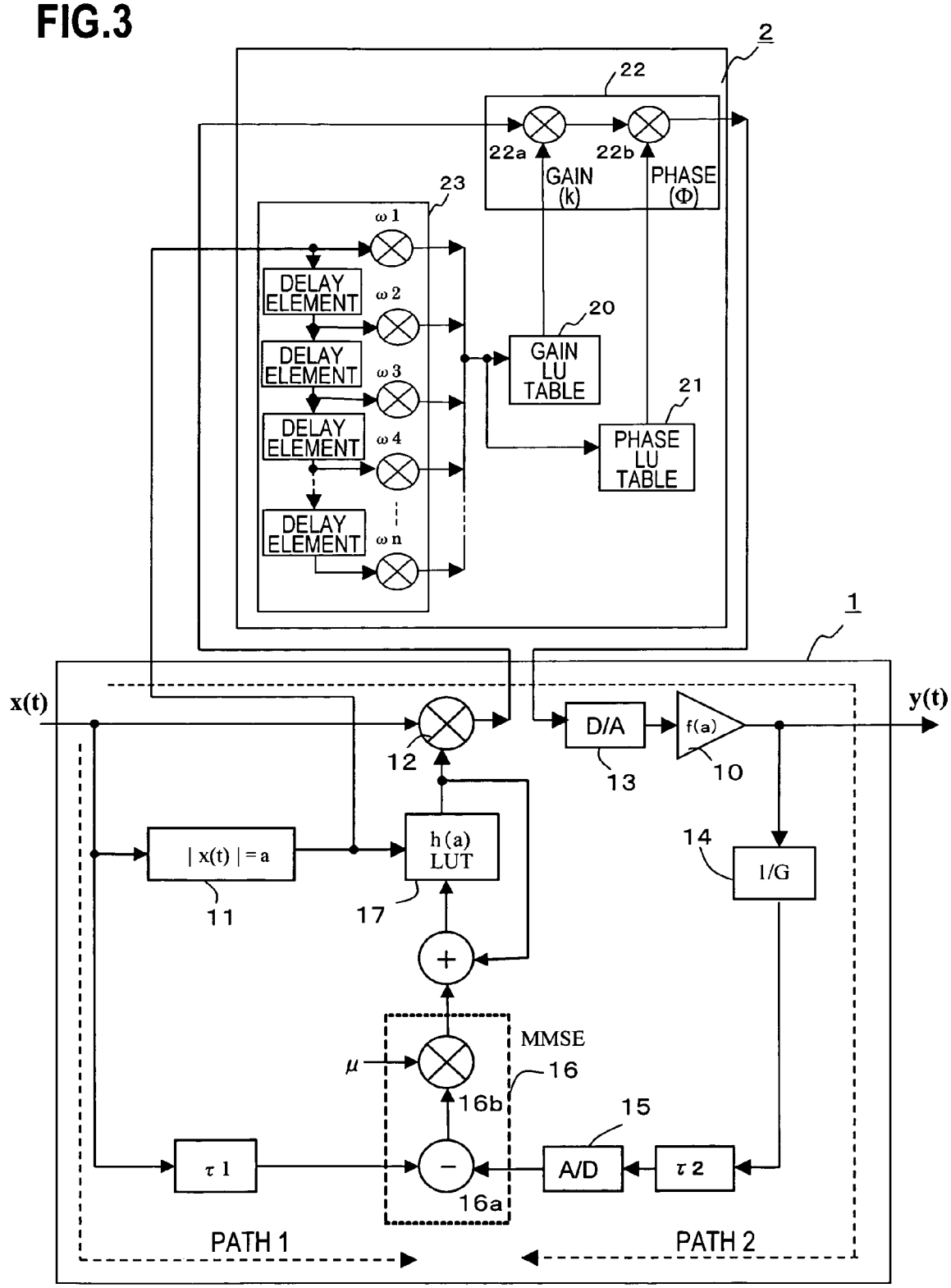
FIG. 3 is a block diagram of an example of the constitution of a power amplifier having a distortion compensation circuit according to the present invention.

FIG. 3 is a block diagram of an example of the constitution of a power amplifier having a distortion compensation circuit in accordance with the present invention. In FIG. 3, the block area 1 shown at the bottom is a diagram showing the basic constitution of a power amplifier having the digital distortion compensation circuit (linearizer) described in the above-mentioned Patent Documents 1 and 2. Furthermore, the block area 2, which is shown at the top of the figure, is the characteristic features according to the present invention, shows an example of the constitution for eliminating the nonlinear distortion caused by the memory effect of the power amplifier, and is additionally provided into the basic constitution 1 of a power amplifier.

In the basic constitution 1 of a power amplifier, if the input signal is represented as x(t), the amplitude can be expressed as a=|x(t)|. Therefore, the amplitude a=|x(t)| is determined by an envelope converter 11.

Here, if h is the compensation coefficient, and f is the distortion function of the power amplifier 10, since both of these are functions of amplitude a, they can be expressed respectively as h(a) and f(a). When these two functions are multiplied by the multiplier 12 to become h(a)f(a), and the constitution 2 for eliminating the nonlinear distortion caused by the memory effect in accordance with the present invention has not been inserted, the product is input to the power amplifier 10 via a D/A converter 13.

If the output of the power amplifier 10 is represented as y(t), this is expressed as equation (1).

$$y(t)=h(a)f(a)x(t) \qquad (1)$$

Here, since h(a)f(a) has to be a constant for any amplitude, it is set that h(a)f(a)=G=constant.

This results in the output y(t) being made proportional to x(t), in other words, the power amplifier 10 becomes linearized.

Computing Δ(t), which is the residual distortion component, as the difference between the feedback component y(t−τ2)/G, which is generated on the feedback path, and the input signal delay signal x(t−τ1) produces equation (2).

That is, $$\Delta(t)=y(t-\tau2)/G-x(t-\tau1) \quad (2)$$

The updating of the distortion compensation coefficient h(a) stored in the lookup table 17 by an MMSE (minimum mean squared error) algorithm in an MMSE circuit 16 continues until the absolute value of this Δ(t) becomes less than a specified threshold.

Here, τ1 expresses the total delay time of the delay element in path 1 in FIG. 3.

τ2 expresses the total delay time for all the delay elements (D/A converter 13, power amplifier 10, digital signal processor 14, A/D converter 15, and so forth) in path 2 in FIG. 3.

Furthermore, updating of the distortion compensation coefficient h(a) conforms to the following recurrence equation (3):

$$hn(a)=hn-1(a)+\mu\Delta(t) \quad (3)$$

Here, μ expresses the extent of revisions (amount of incremental steps) when revising the following steps.

The updating of the lookup table 17 in which the value of h(a) is stored stops when the above-mentioned error Δ(t) converges below a specified value. Or, the above-mentioned update algorithm commences in accordance with the appropriate cycle to cope with parameter fluctuations resulting from temperature changes and changes over time. This makes it possible to achieve stable operation relative to a variety of parameter fluctuations.

However, distortion caused by the memory effect in the above-mentioned power amplifier 10 cannot be compensated for in the above-mentioned operation in the power amplifier basic constitution 1. Therefore, the present invention further provides a constitution for suppressing the memory effect.

Figure 4:
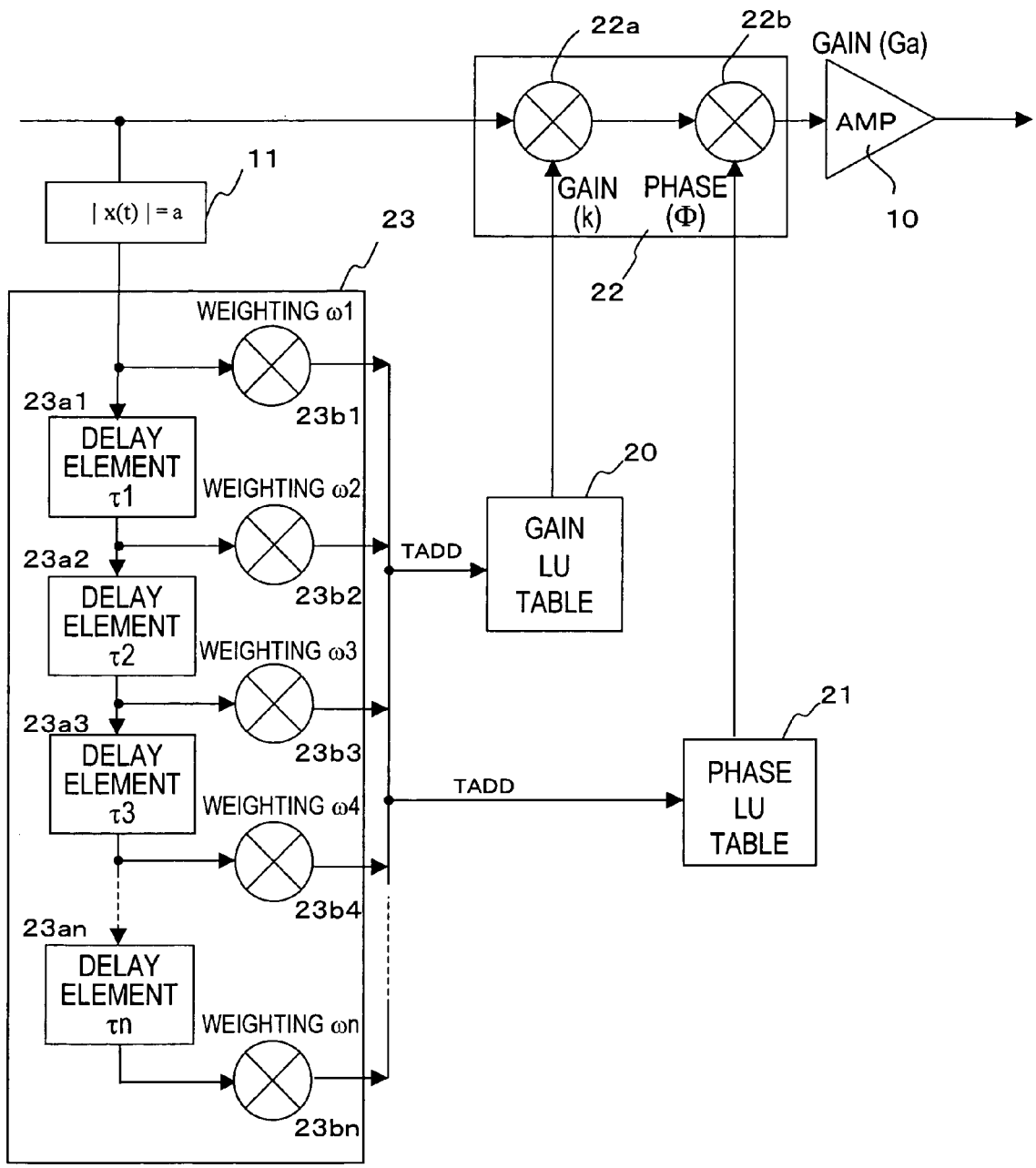
FIG. 4 is an enlarged view of a second example of the constitution for suppressing the memory effect, which is the characteristic feature of the present invention in FIG. 3.

FIG. 4 shows an enlarged view of example 2 in FIG. 3 of the memory effect-suppressing constitution, which is the characteristic feature of the present invention.

In FIG. 4, in the input side of the amplifier 10, which has gain (Ga), there is a multiplier 22 for carrying out modulation using the gain coefficient k and phase coefficient Φ for further suppressing the memory effect relative to the signal modulated using the distortion compensation coefficient h(a) in the multiplier 12 for the input signal x(t) to be amplified.

More specifically, the multiplier 22 has a gain-coefficient multiplier 22a for multiplying the gain coefficient k, and a phase-coefficient multiplier 22b for multiplying the phase coefficient Φ.

The gain coefficient k and phase coefficient Φ multiplied by the gain-coefficient multiplier 22a and phase-coefficient multiplier 22b are respectively read out from the gain lookup table 20 and the phase lookup table 21.

Figure 1:
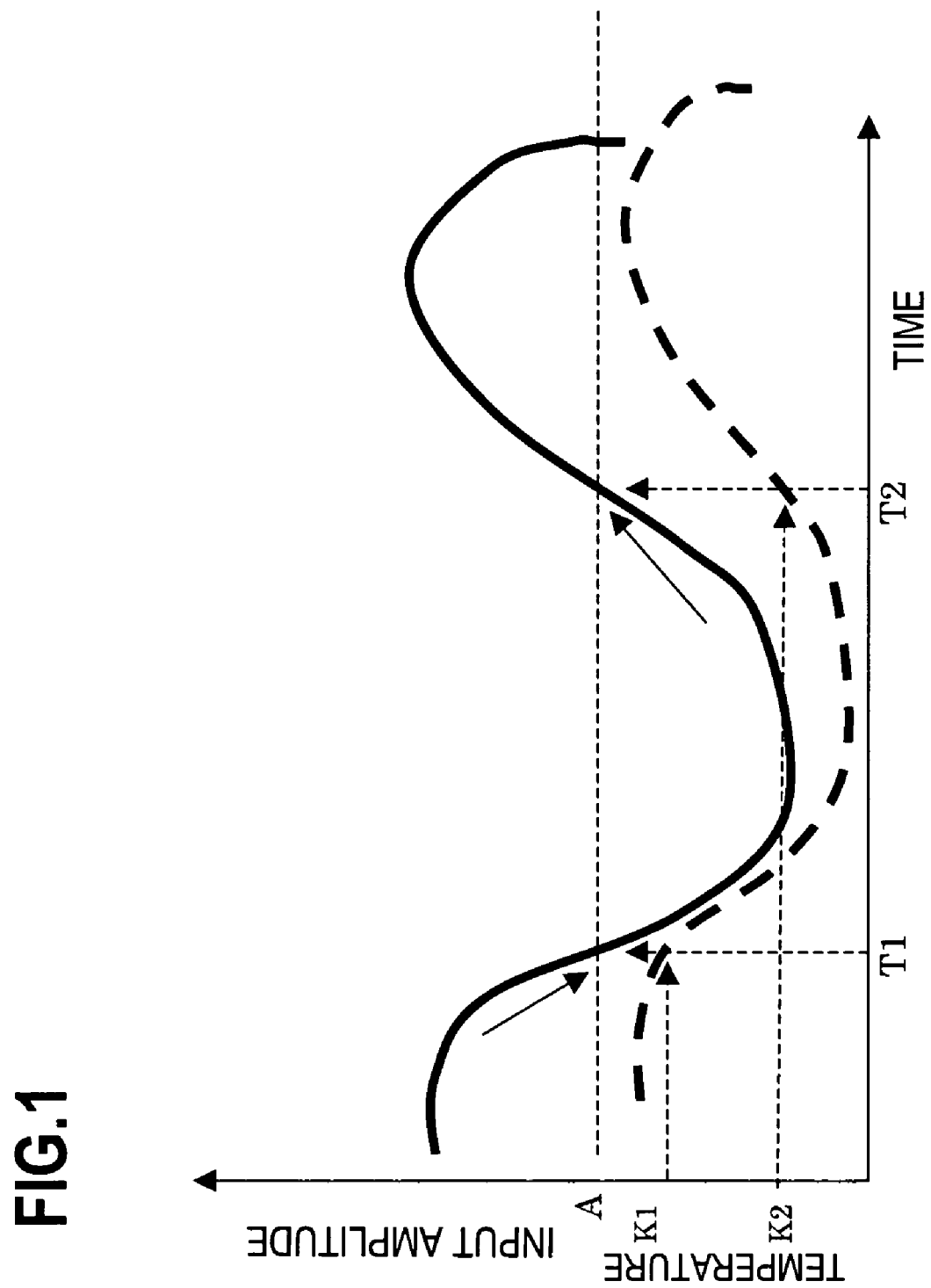
FIG. 1 is a diagram showing an example of the memory effect in an amplifier.
Figure 2:
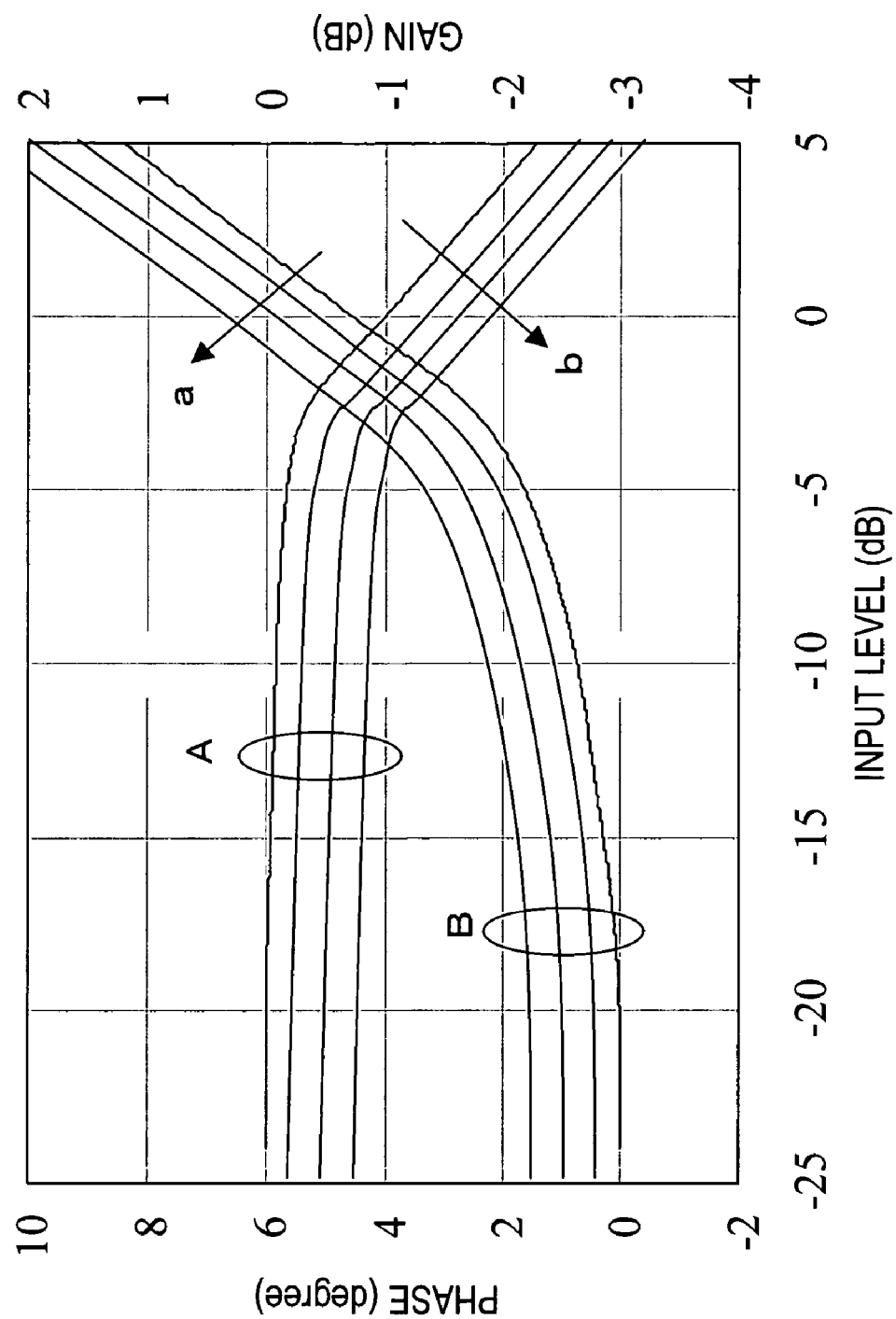
FIG. 2 is a diagram illustrating the changes in AM/AM, AM/PM characteristics as a result of temperature.

As will be explained below, the AM/AM characteristic (FIG. 2, a), which fluctuates in accordance with the temperature described using FIG. 2, is measured, and the compensation value determined thereby is stored in the gain lookup table 20 as the gain coefficient k. Similarly, the AM/PM characteristic (FIG. 2, b), which fluctuates in accordance with the temperature, is measured, and the compensation value determined thereby is stored in the phase lookup table 21 as the phase coefficient Φ.

In FIG. 4, the amplitude value a=|x(t)| determined by the envelope converter 11 is input to the transversal filter 23. The amplitude value a=|x(t)| is input to the multiplier 22 at the same time.

The transversal filter 23 is constituted having a plurality of delay devices 23a1 through 23an, and multipliers 23b1 through 23bn, which apply weighting coefficients ω1 through ωn to the respective taps of the delay devices 23a1 through 23an. The present invention perturbs the weighting coefficients in these multipliers 23b1 through 23bn, and sets the optimum value of the temperature address (TADD), which become the readout address of the gain lookup table 20 and the phase lookup table 21.

Next, the methods for determining the gain coefficient k and the phase coefficient Φ, which are stored in the gain lookup table 20 and phase lookup table 21, will be explained.

First, a pulse signal having a pulse width Tw, an amplitude Ak, and a pulse duration Td, is applied as input, the amplitude difference with the output power detected at this time is set as Ad(Tw, Ak, Td) and the phase difference with the output power detected at this time is set as Φd(Tw, Ak, Td), the amount of change of the amplitude difference Ad and the amount of change of the phase difference Φd when the amplitude Ak is changed by ΔA are measured, and the respective change ratios Gd, Pd are defined by the following equations.

$$Gd=\{Ad(Tw,Ak,Td)-Ad(Tw,Ak+\Delta A,Td)\}/\Delta A$$

$$Pd=\{\Phi d(Tw,Ak,Td)-\Phi d(Tw,Ak+\Delta A,Td)\}/\Delta A$$

The above-mentioned Gd and Pd are respectively set as the gain coefficient value and the phase coefficient value stored in the above-mentioned gain lookup table and phase lookup table.

Furthermore, the above-mentioned change ratios Gd and Pd must be determined corresponding to the passage of time, that is, corresponding to the AM/AM and AM/PM characteristics, which change in accordance with the cumulative heat temperature.

Figure 5:
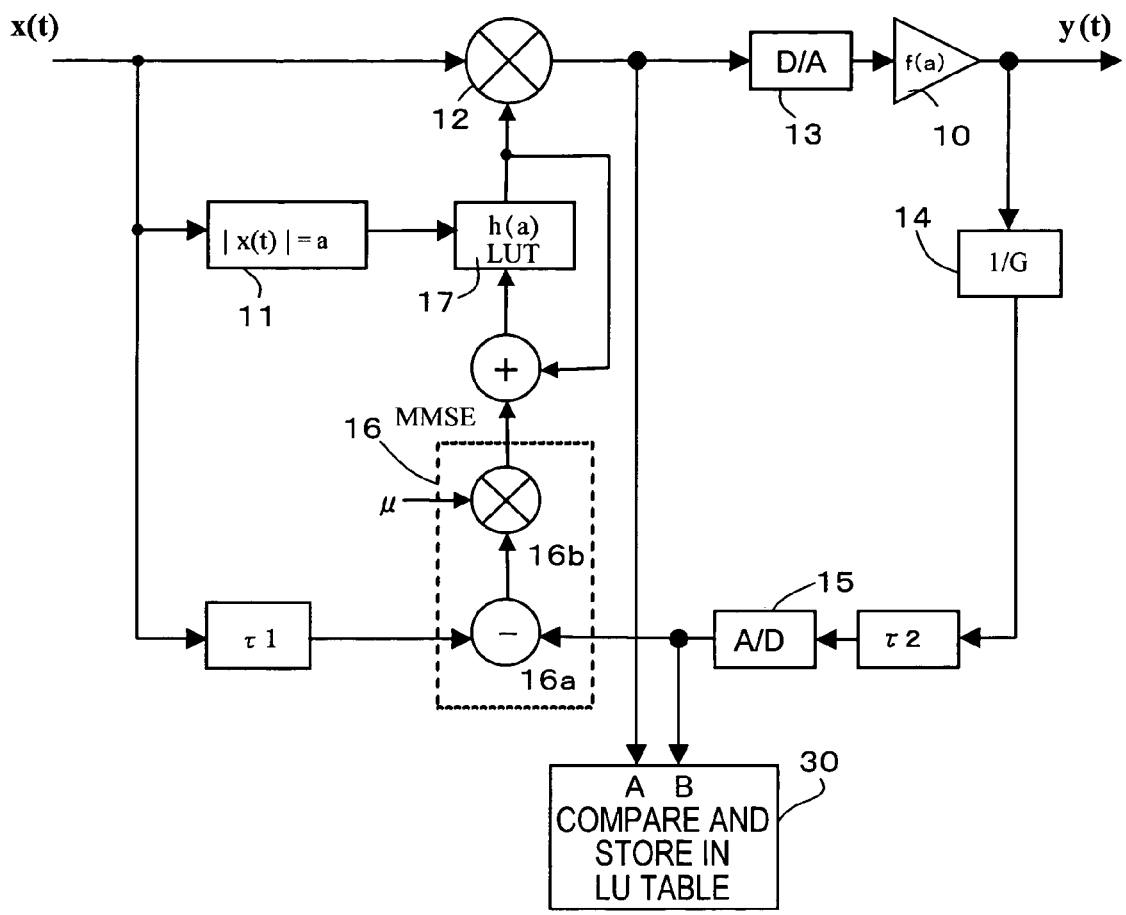
FIG. 5 is a diagram reproducing area 1 shown in the bottom portion of FIG. 3.
Figure 6:
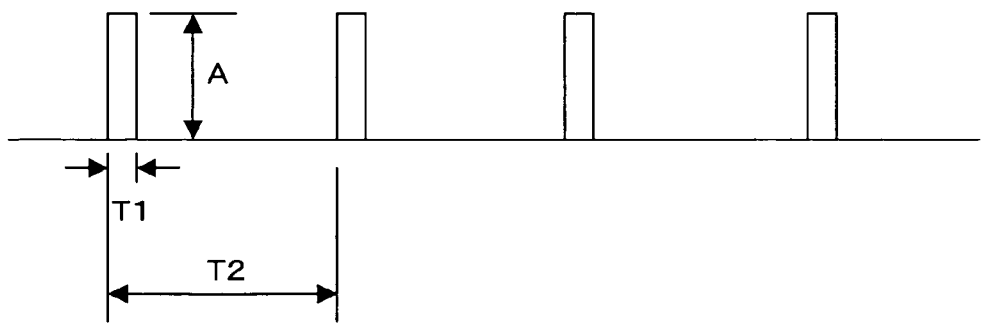
FIG. 6 is a diagram illustrating the transmission signal pulse output by a controller 30.

FIG. 5 is a diagram reproducing the area 1 shown at the bottom of FIG. 3. In FIG. 5, the controller 30 inputs a signal of pulse width T1 as the transmission signal as shown in FIG. 6. At the same time, a predistortioned transmission signal A (=h(a)x(t)), which is the output of the multiplier 12, and a feedback signal B (=y(t)), which is the output of the A/D converter 15, are input to the controller 30.

The controller 20 compares signals A and B, and determines the AM/AM characteristic and AM/PM characteristic described using FIG. 2 by changing the pulse width T1 and cycle T2.

At this time, the AM/AM characteristic and AM/PM characteristic, when set to the minimum pulse width T1, are treated as the characteristics at normal temperatures. Furthermore, the state where the AM/AM characteristic and AM/PM characteristic become fixed and cease to change is treated as the characteristic at maximum temperature.

The resolution between the differences of the AM/AM characteristic and AM/PM characteristic at the above-mentioned normal temperature and maximum temperature is represented as N, and the above-described AM/AM characteristic and AM/PM characteristic data determined corresponding to the temperature at (maximum temperature−normal temperature)/N are respectively stored in the corresponding gain lookup table 20 and phase lookup table 21.

Therefore, the temperature corresponding to the input amplitude becomes the address, and the gain coefficient value and phase coefficient value read out corresponding to the address temperature (TADD) are respectively input to the gain multiplier 22a and phase multiplier 22b.

Furthermore, the respective parameters τ1 through τn, and ω1 through ωn of the transversal filter 23 are determined by the perturbation method such that the amplitude value a=|x(t)| of the transmission signal x(t) corresponds to the optimum temperature address (TADD).

INDUSTRIAL APPLICABILITY

As explained hereinabove in accordance with the figures, the present invention makes possible nonlinear distortion compensation, which readily eliminates the memory effect of a power amplifier. Consequently, the power efficiency of a power amplifier can be enhanced, increasing its industrial applicability.

What is claimed is:

1. A power amplifier having a distortion compensation circuit, which compares a input signal power against a sampled component of an output power, and provides predistortion to the input signal power so as to minimize a difference as a result of the comparison, the power amplifier comprising:
   a gain lookup table storing a gain coefficient value corresponding to a temperature address determined for an input power;
   a phase lookup table storing a phase coefficient value corresponding to the temperature address determined for the input power;
   a transversal filter, which is input with the input power, and which outputs the temperature address; and
   a coefficient multiplier modulating the input signal using a gain coefficient value and a phase coefficient value, which correspond to the temperature address and which are read out from the gain coefficient lookup table and the phase lookup table, wherein
   a gain coefficient value and a phase coefficient value, which are respectively stored in the gain lookup table and phase lookup table, are determined by
   applying a pulse signal having a pulse width Tw, an amplitude Ak, and a pulse duration Td, as input,
   taking the amplitude difference with the output power detected at this time as Ad (Tw, Ak, Td) and taking the phase difference with the output power detected at this time as φd (Tw, Ak, Td),
   measuring an amount of change of the amplitude difference Ad and an amount of change of the phase difference φd when the amplitude Ak is changed by ΔA, and
   defining the respective change ratios Gd, Pd by the following equations:

$Gd=\{Ad(Tw,Ak,Td)-Ad(Tw,Ak+\Delta A,Td)\}/\Delta A$ $Pd=\{\phi d(Tw,Ak,Td)-\phi d(Tw,Ak+\Delta A,Td)\}/\Delta A,$ the Gd and Pd being respectively set as the gain coefficient value and the phase coefficient value stored in the gain lookup table and phase lookup table.

2. A power amplifier having a distortion compensation which compares a input signal power against a sampled component of an output power, and provides predistortion to the input signal power so as to minimize a difference as a result of the comparison, the power amplifier comprising:
   a distortion compensation coefficient lookup table, which stores a distortion compensation coefficient in a storage area having a specified write address, and outputs a distortion compensation coefficient stored in a storage area having a specified readout address;
   a first multiplier modulating the input signal using a distortion compensation coefficient output from the distortion compensation coefficient lookup table;
   a distortion compensation operator unit computing a distortion compensation coefficient based on the power of the input signal and an amplified transmission signal, wherein a distortion compensation coefficient stored in the distortion compensation coefficient lookup table is undated using the distortion compensation coefficient computed by the distortion compensation operator unit,
   a gain lookup table storing a gain coefficient value corresponding to a temperature address determined for the input power;
   a phase lookup table storing a phase coefficient value corresponding to a temperature address determined for the input power;
   a transversal filter, which is input with the input power, and which outputs the temperature address; and
   a second multiplier modulating the output of the first multiplier by using a gain coefficient value and a phase coefficient value, which correspond to the temperature address and which are read out from the gain coefficient lookup table and phase lookup table, wherein
   a gain coefficient value and a phase coefficient value, which are respectively stored in the gain lookup table and phase lookup table, are determined by
   applying a pulse signal having a pulse width Tw, an amplitude Ak, and a pulse duration Td, as input,
   taking the amplitude difference with the output power detected at this time as Ad (Tw, Ak, Td) and taking the phase difference with the output power detected at this time as φd (Tw, Ak, Td),
   measuring an amount of change of the amplitude difference Ad and an amount of change of the phase difference φd when the amplitude Ak is changed by ΔA, and
   defining the respective change ratios Gd, Pd by the following equations:

$Gd=\{Ad(Tw,Ak,Td)Ad(Tw,Ak+\Delta A,Td)\}/\Delta A$ $Pd=\{\phi d(Tw,Ak,Td)-\phi d(Tw,Ak+\Delta A,Td)\}/\Delta A,$ the Gd and Pd being respectively set as the gain coefficient value and the phase coefficient value stored in the gain lookup table and phase lookup table.

3. The power amplifier having a distortion compensation circuit according to claim 1, wherein the pulse width Tw and pulse duration Td are further changed, and the AM/AM characteristic and the AM/PM characteristic when the pulse width Tw is a minimum value are treated as normal temperature characteristics, and when the AM/AM characteristic and the AM/PM characteristic cease to change are treated as the maximum temperature characteristics, and wherein the change ratios Gd and Pd are determined for an AM/AM characteristic and an AM/PM characteristic determined corresponding to the temperature of (maximum temperature normal temperature)/N taking resolution as N.

4. The power amplifier having a distortion compensation circuit according to claim 2, wherein the pulse width Tw and pulse duration Td are further changed, and the AM/AM characteristic and the AM/PM characteristic when the pulse width Tw is a minimum value are treated as normal temperature characteristics, and when the AM/AM characteristic and the AM/PM characteristic cease to change are treated as the maximum temperature characteristics, and wherein the change ratios Gd and Pd are determined for an AM/AM characteristic and an AM/PM characteristic determined corresponding to the temperature of (maximum temperature normal temperature)/N taking resolution as N.

5. The power amplifier having a distortion compensation circuit according to claim 3, wherein weighting coefficients for the respective taps of the transversal filter are perturbed, and are set so as to output an optimum temperature address for minimizing the distortion component.

6. The power amplifier having a distortion compensation circuit according to claim 4, wherein weighting coefficients for the respective taps of the transversal filter are perturbed, and are set so as to output an optimum temperature address for minimizing the distortion component.

* * * * *